US011521880B2

(12) United States Patent
Takahata et al.

(10) Patent No.: US 11,521,880 B2
(45) Date of Patent: Dec. 6, 2022

(54) SUBSTRATE PROCESSING APPARATUS AND RECORDING MEDIUM FOR CHANGING ATMOSPHERE OF TRANSFER CHAMBER

(71) Applicant: KOKUSAI ELECTRIC CORPORATION, Tokyo (JP)

(72) Inventors: Satoru Takahata, Toyama (JP); Ichiro Nunomura, Toyama (JP); Tsukasa Iida, Toyama (JP); Hitoshi Sekihara, Toyama (JP); Kazunori Tsutsuguchi, Toyama (JP); Jin Shibata, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/522,265

(22) Filed: Jul. 25, 2019

(65) Prior Publication Data

US 2020/0035533 A1 Jan. 30, 2020

(30) Foreign Application Priority Data

Jul. 27, 2018 (JP) .............................. JP2018-141216

(51) Int. Cl.
*H01L 21/677* (2006.01)
*C23C 14/56* (2006.01)
(Continued)

(52) U.S. Cl.
CPC ...... *H01L 21/67757* (2013.01); *C23C 14/564* (2013.01); *C23C 16/4408* (2013.01);
(Continued)

(58) Field of Classification Search
None
See application file for complete search history.

(56) References Cited

U.S. PATENT DOCUMENTS

| 5,447,294 A | 9/1995 | Sakata et al. |
| 2008/0105204 A1 | 5/2008 | Nakada et al. |

(Continued)

FOREIGN PATENT DOCUMENTS

| JP | 2003-097802 A | 1/2003 |
| JP | 2007-095879 A | 4/2007 |

(Continued)

OTHER PUBLICATIONS

Taiwanese Office Action dated Feb. 6, 2020 for the Taiwanese Patent Application No. 108115022.

(Continued)

*Primary Examiner* — Binu Thomas
(74) *Attorney, Agent, or Firm* — Volpe Koenig

(57) ABSTRACT

There is provided a configuration that includes: an intake damper and an intake fan configured to communicate with an intake port that sucks air to a transfer chamber connected to a process chamber; a valve of an inert gas introduction pipe configured to supply an inert gas to the transfer chamber; an exhaust fan and a first exhaust valve installed in the transfer chamber; a switch configured to select one of an atmospheric mode in which an atmosphere of the transfer chamber is an air atmosphere and a purge mode in which the atmosphere of the transfer chamber is an inert gas atmosphere; and a controller configured to control each of the intake damper, the intake fan, the valve of the inert gas introduction pipe, the exhaust fan, and the first exhaust valve to execute one of the atmospheric mode and the purge mode.

13 Claims, 31 Drawing Sheets

(51) Int. Cl.
  *C23C 16/44* (2006.01)
  *H01L 21/673* (2006.01)
  *H01L 21/67* (2006.01)
(52) U.S. Cl.
  CPC .. *H01L 21/67196* (2013.01); *H01L 21/67389* (2013.01); *H01L 21/67739* (2013.01)

(56) References Cited

U.S. PATENT DOCUMENTS

| | | | |
|---|---|---|---|
| 2009/0044749 A1* | 2/2009 | Ozaki | H01L 21/67017 118/698 |
| 2010/0111648 A1 | 5/2010 | Tamura et al. | |
| 2011/0305543 A1* | 12/2011 | Nakashima | H01L 21/67017 414/217.1 |
| 2012/0083120 A1* | 4/2012 | Nakada | H01L 21/67017 156/345.31 |
| 2012/0108077 A1 | 5/2012 | Kaga et al. | |
| 2015/0045961 A1* | 2/2015 | Koshti | H01L 21/67772 700/276 |
| 2018/0148834 A1* | 5/2018 | Kamimura | H01L 21/67017 |
| 2019/0093219 A1* | 3/2019 | Hayashi | H01L 21/67017 |
| 2019/0267258 A1* | 8/2019 | Rice | H01L 21/67389 |

FOREIGN PATENT DOCUMENTS

| | | |
|---|---|---|
| JP | 2008-141176 A | 6/2008 |
| JP | 2009-065113 A | 3/2009 |
| JP | 2009-253217 A | 10/2009 |
| JP | 2012-107317 A | 6/2012 |
| KR | 10-0251873 B1 | 4/2000 |
| KR | 2009-0017421 A | 2/2009 |
| KR | 2011-0136736 A | 12/2011 |

OTHER PUBLICATIONS

Korean Office Action dated Nov. 21, 2020 for Korean Patent Application No. 10-2019-0089512.
Japanese Office Action dated Jan. 5, 2021 for Japanese Patent Application No. 2018-141216.
Taiwan Office Action dated Jan. 6, 2022 for Taiwan Patent Application No. 108115022.

* cited by examiner

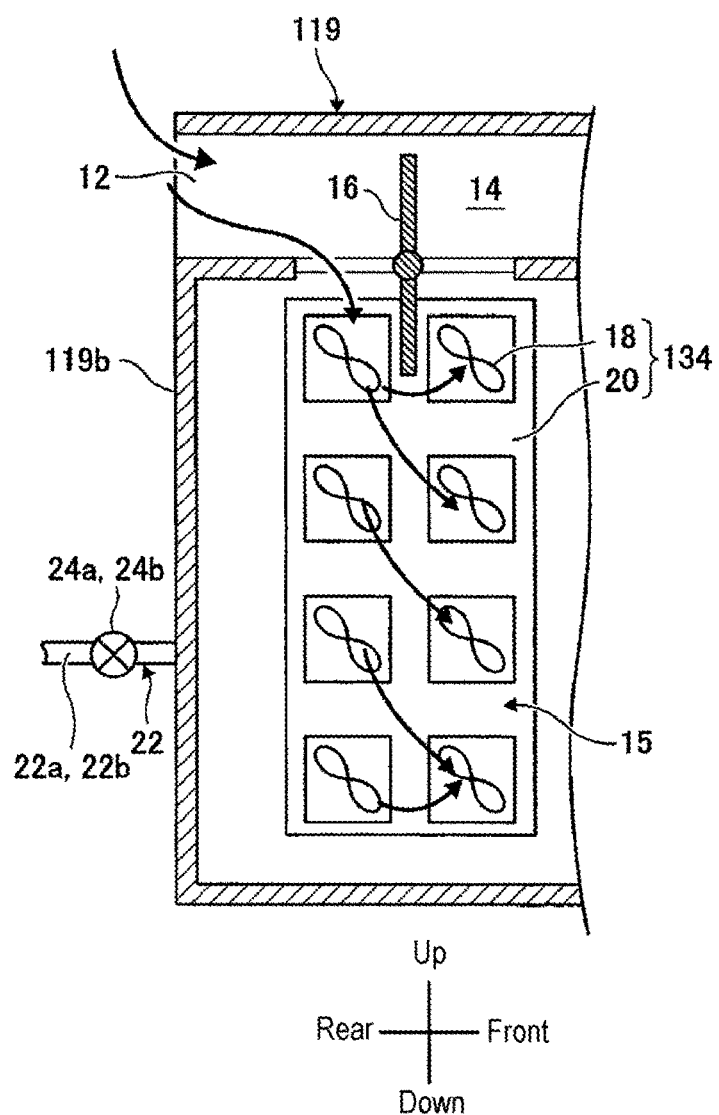

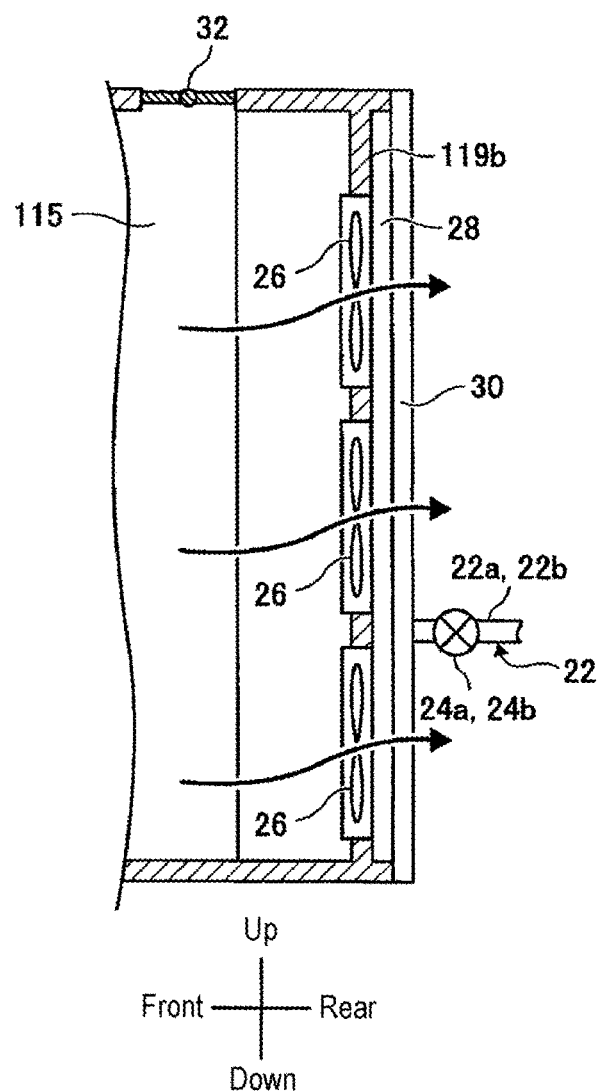

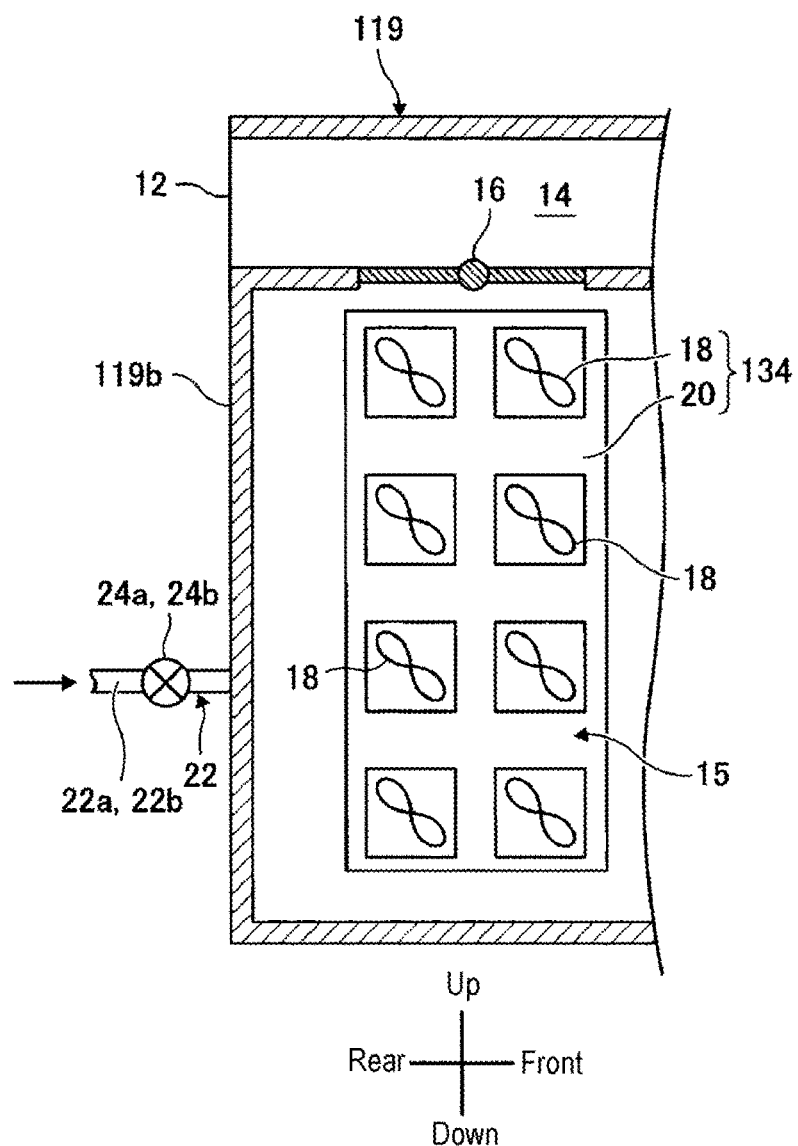

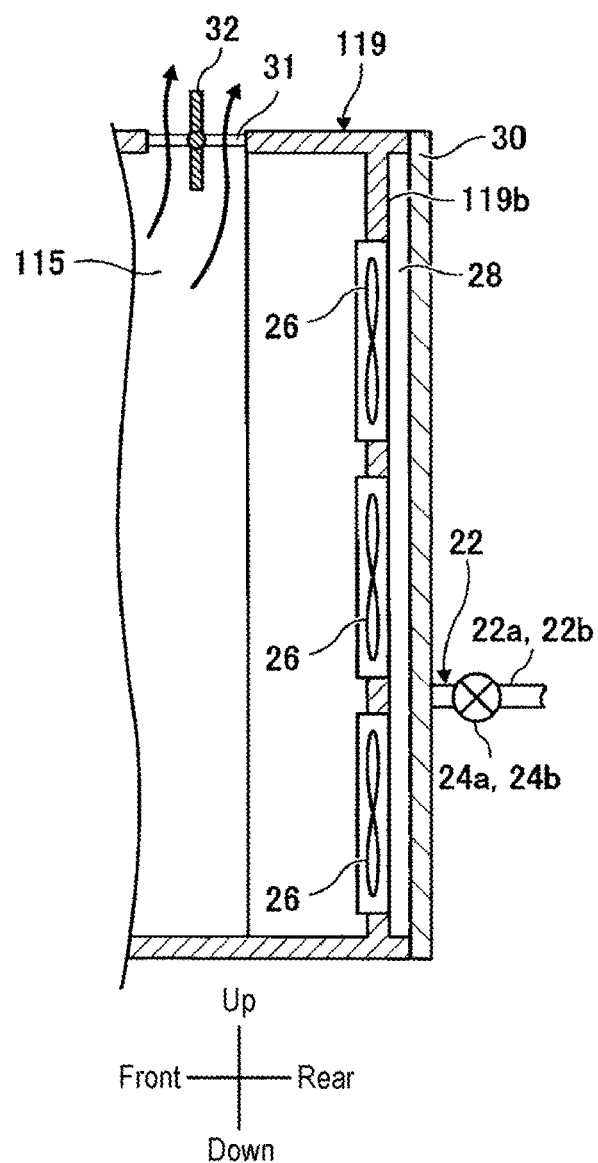

Changeover switch OFF

Changeover switch OFF

Changeover switch OFF

Transfer shelf gate valve closed

Changeover switch OFF

Transfer chamber purge substitution

Changeover switch OFF

Changeover switch OFF

Oxygen concentration 18.5% or more

Changeover switch OFF

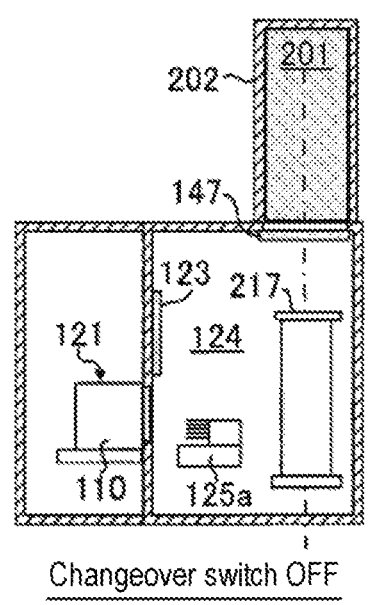

Changeover switch OFF

Changeover switch OFF

Changeover switch OFF

Changeover switch ON

Transfer shelf gate valve closed

Transfer chamber purge substitution

Changeover switch OFF

Changeover switch OFF

Oxygen concentration 18.5% or more

Changeover switch OFF

Changeover switch OFF

Changeover switch OFF

Changeover switch OFF

Changeover switch OFF

Transfer shelf gate valve closed

Changeover switch OFF

Transfer chamber purge substitution

Changeover switch ON

Changeover switch OFF

Oxygen concentration 18.5% or more

Changeover switch OFF

Changeover switch OFF

Changeover switch OFF

Changeover switch OFF

Changeover switch ON

Transfer shelf gate valve opened

Changeover switch ON

Changeover switch OFF

Changeover switch OFF

SUBSTRATE PROCESSING APPARATUS AND RECORDING MEDIUM FOR CHANGING ATMOSPHERE OF TRANSFER CHAMBER

CROSS-REFERENCE TO RELATED APPLICATION

This application is based upon and claims the benefit of priority from Japanese Patent Application No. 2018-141216, filed on Jul. 27, 2018, the entire contents of which are incorporated herein by reference.

TECHNICAL FIELD

The present disclosure relates to a substrate processing apparatus and a recording medium.

BACKGROUND

In a substrate processing apparatus in which a process chamber and a transfer chamber are connected, the interior of the transfer chamber is substituted by an inert gas atmosphere to prevent natural oxidation of a substrate.

However, influence of a natural oxide film before and after processing may be small according to a kind of a process or a kind of a film to be formed. In this case, it may be preferable that the transfer chamber be in an air atmosphere rather than in an inert gas atmosphere.

SUMMARY

The present disclosure provides some embodiments of a configuration in which an atmosphere of a transfer chamber can be changed according to a kind of a process or a kind of a film to be formed.

According to one or more embodiments of the present disclosure, there is provided a configuration that includes: an intake damper and an intake fan configured to communicate with an intake port that sucks air to a transfer chamber connected to a process chamber in which processing of a substrate is performed; a valve of an inert gas introduction pipe configured to supply an inert gas to the transfer chamber; an exhaust fan and a first exhaust valve installed in the transfer chamber; a switch configured to select one of an atmospheric mode in which an atmosphere of the transfer chamber is an air atmosphere and a purge mode in which the atmosphere of the transfer chamber is an inert gas atmosphere; and a controller configured to control each of the intake damper, the intake fan, the valve of the inert gas introduction pipe, the exhaust fan, and the first exhaust valve to execute one of the atmospheric mode and the purge mode.

BRIEF DESCRIPTION OF DRAWINGS

FIG. 4A is a partial cross sectional view of a sub housing on a right side of the apparatus when a transfer chamber is in an air atmosphere, and FIG. 4B is a partial cross sectional view of the sub housing on a left side of the apparatus when the transfer chamber is in an air atmosphere.

FIG. 5A is a partial cross sectional view of the sub housing on the right side of the apparatus when the transfer chamber is in an inert gas atmosphere, and FIG. 5B is a partial cross sectional view of the sub housing on the left side of the apparatus when the transfer chamber is in an inert gas atmosphere.

FIGS. 8A to 8K are views illustrating an example (pattern 1) of an operation in the transfer chamber of the substrate processing apparatus suitably used in embodiments of the present disclosure.

DETAILED DESCRIPTION

One or More Embodiments of the Present Disclosure

One or more embodiments of the present disclosure will now be described.

(1) Configuration of the Substrate Processing Apparatus

Figure 1:
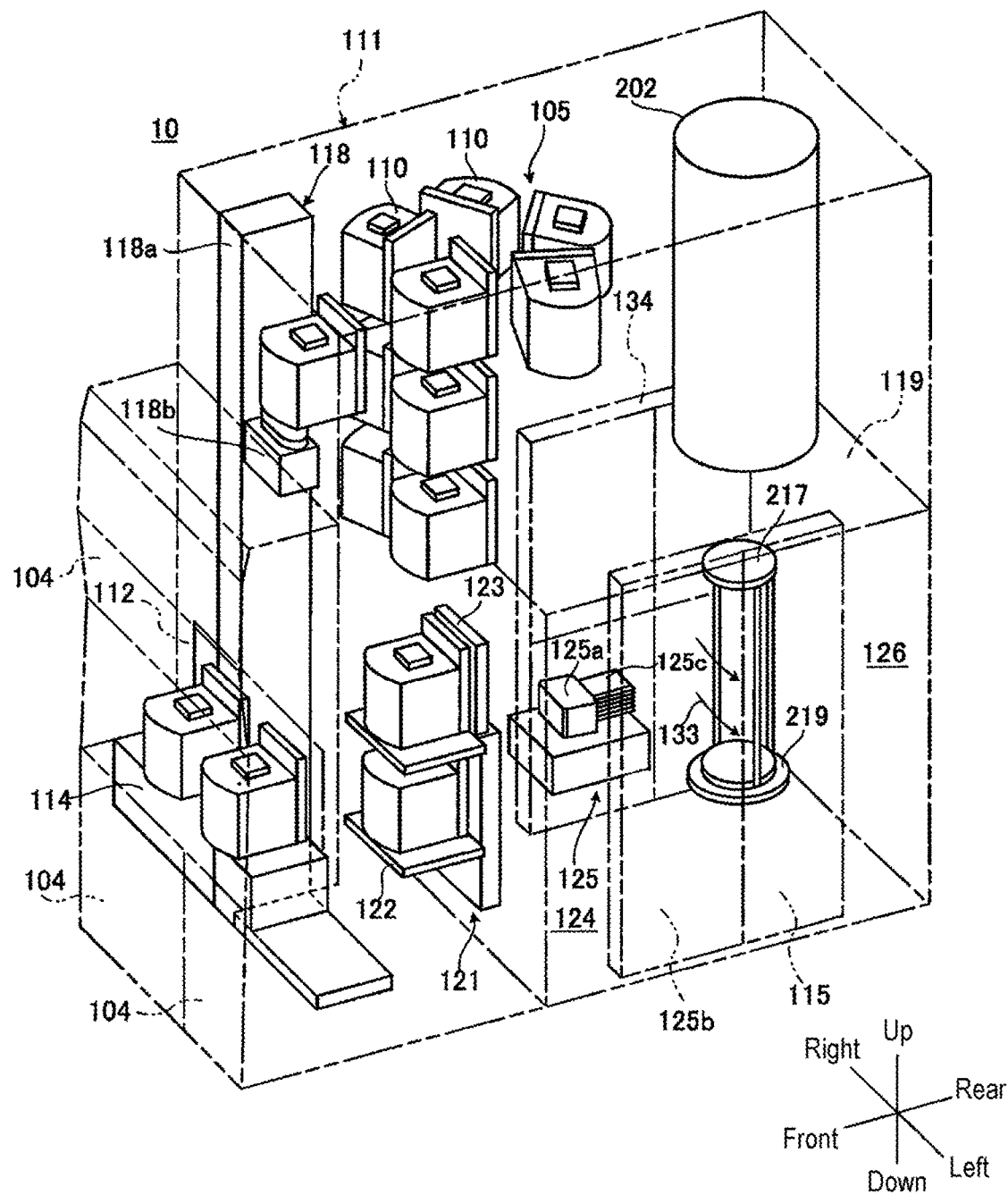
FIG. 1 is a perspective view of a substrate processing apparatus suitably used in embodiments of the present disclosure.
Figure 2:
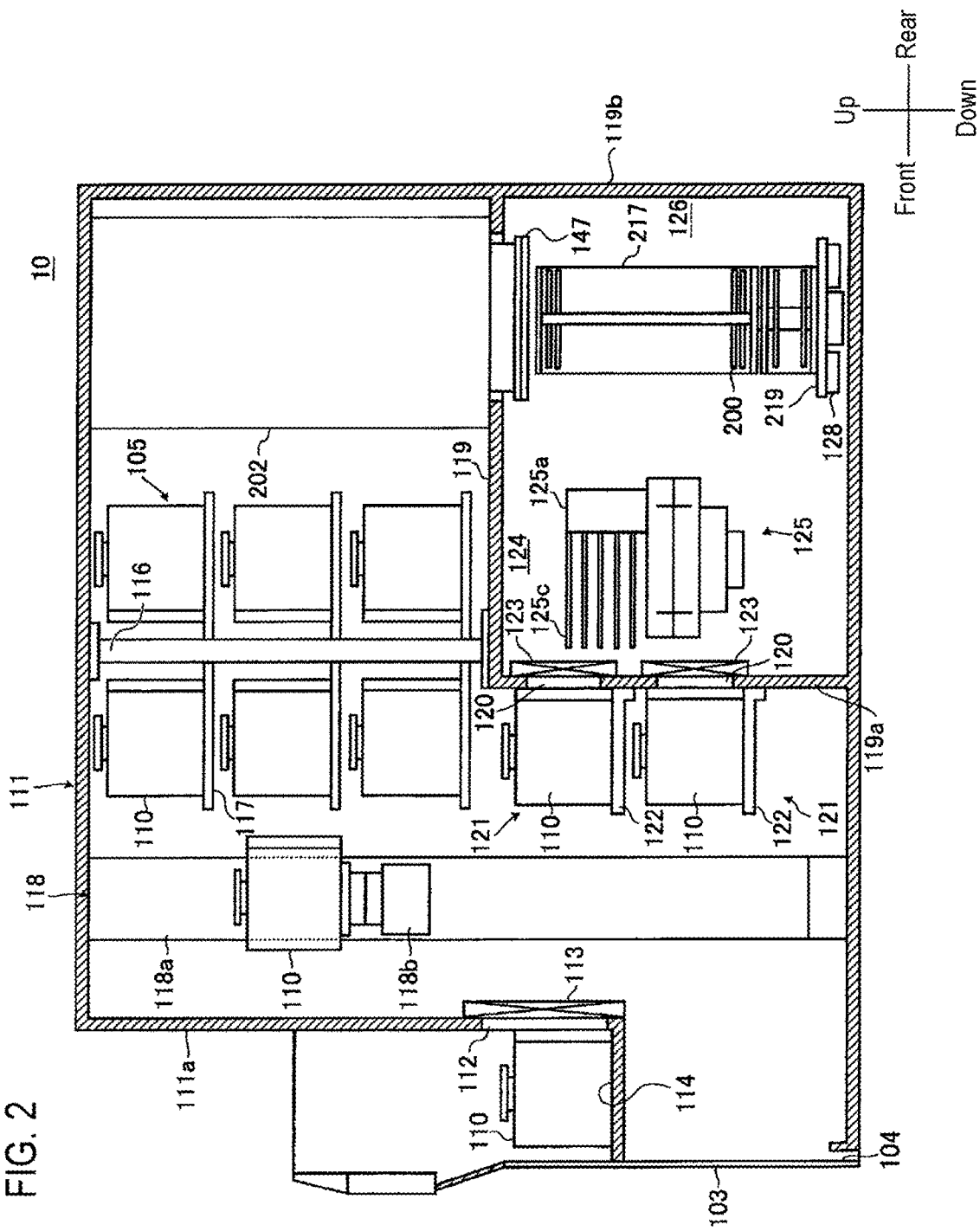
FIG. 2 is a side perspective view illustrating the substrate processing apparatus suitably used in embodiments of the present disclosure.

As illustrated in FIGS. 1 and 2, a substrate processing apparatus 10 according to the present embodiments includes a housing 111 used as a main body of the substrate processing apparatus. A predetermined number of wafers 200 as substrates made of silicon or the like are accommodated in the housing 111, and FOUPs (also referred to as PODs, hereinafter, referred to as pods) 110 are used as wafer carriers as accommodating containers. Further, in FIGS. 1 and 2, when a maintenance door 104 side is defined as the front of the apparatus and a standby part 126 side is defined as the rear of the apparatus as described below, and when they are also described as the front and rear of the apparatus in other drawings, the description will be made under the same definition. Similarly, the right side toward the front of the apparatus is defined as the right side of the apparatus and the left side toward the front of the apparatus is defined as the left side of the apparatus for description.

A front maintenance port 103 as an opening installed for maintenance is opened at a front portion of a front wall 111a of the housing 111, and front maintenance doors 104 for opening and closing the front maintenance port 103 are respectively installed. A pod loading/unloading port 112 is opened on the front wall 111a of the housing 111 so as to communicate the inside and outside of the housing 111, and is configured to be opened and closed by a front shutter 113. A load port 114 used as a loading/unloading part is installed on the front side of the pod loading/unloading port 112, and is configured so that the pods 110 are mounted thereon and arranged. The pods 110 are loaded into and unloaded from the load port 114 by an in-process transfer device (not shown) such as overhead hoist transport (OHT) or the like.

A pod shelf (receiving shelf) 105 is installed at an upper portion of a substantially central portion in a front and rear direction in the housing 111. The pod shelf 105 has a support part 116 which is vertically erected, and a plurality of stages of mounting parts 117 supported so as to be independently moved in the vertical direction, for example, at respective positions of upper, middle, and lower stages with respect to the support part 116. The pod shelf 105 is configured to support a plurality of pods 110 respectively mounted on the plurality of stages of mounting parts 117. That is, the pod shelf 105 accommodates the plurality of pods 110 in multiple stages along the vertical direction by arranging, for example, two pods 110, in the same direction on one straight line.

A pod transfer device (accommodating container transfer mechanism) 118 is installed between the load port 114 and the pod shelf 105 in the housing 111. The pod transfer device 118 includes a pod elevator 118a as a shaft part vertically movable while supporting the pods 110, and a pod transfer portion 118b as a transfer part for horizontally transferring the pods 110 mounted thereon. The pod transfer device 118 is also configured to transfer the pods 110 among the load port 114, the pod shelf 105, and pod openers 121 by continuous operation of the pod elevator 118a and the pod transfer portion 118b.

A sub housing 119 is established over the rear end portion at a lower portion of a substantially central portion in the front and rear direction in the housing 111. Wafer-loading/unloading ports 120 for loading and unloading the wafers 200 into and from the sub housing 119 are opened on a front wall 119a of the sub housing 119, for example, so as to be arranged in two upper and lower stages along the vertical direction, and a pair of pod openers 121 are installed at the upper and lower wafer-loading/unloading ports 120, respectively. The pod openers 121 each includes a mounting table 122 on which the pods 110 are mounted, and a cap-attaching/detaching mechanism (not shown) for attaching and detaching a cap of the pods 110 used as a sealing member. The pod openers 121 are configured to open and close a wafer inlet/outlet port of the pods 110 by attaching and detaching the cap of the pods 110 mounted on the mounting table 122 by the cap-attaching/detaching mechanism.

The sub housing 119 constitutes a transfer chamber (auxiliary chamber) 124 fluidly isolated from the installation space of the pod transfer device 118 and the pod shelf 105. The installation space of the pod transfer device 118 and the pod shelf 105, and the transfer chamber 124 are connected via transfer shelf gate valves 123.

The transfer shelf gate valves 123 each closes the wafer-loading/unloading ports 120 to make the transfer chamber 124 into a closed space. That is, the wafer inlet/outlet port of the pods 110 is opened and closed by the cap-attaching/detaching mechanism so that the transfer shelf gate valve 123 is opened to allow the wafers 200 to be loaded into and unloaded from the pods 110. The transfer shelf gate valve 123 may also serve as the cap-attaching/detaching mechanism. The transfer chamber 124 is used as a transfer area of the wafers 200 and as a loading/unloading space of a boat (substrate support) 217 as described hereinbelow.

The standby part 126, which receives the boat 217 and stands by it, is configured in a rear region of the transfer chamber 124. A process furnace 202 is installed above the standby part 126, and a lower portion of the process furnace 202 is configured to be opened and closed by a furnace port shutter (furnace-port-opening/closing mechanism) 147. A process chamber 201 is formed in the process furnace 202.

<Transfer Chamber>

Next, an internal configuration of the transfer chamber 124 will be described in detail with reference to FIGS. 3 to 5B.

Figure 3:
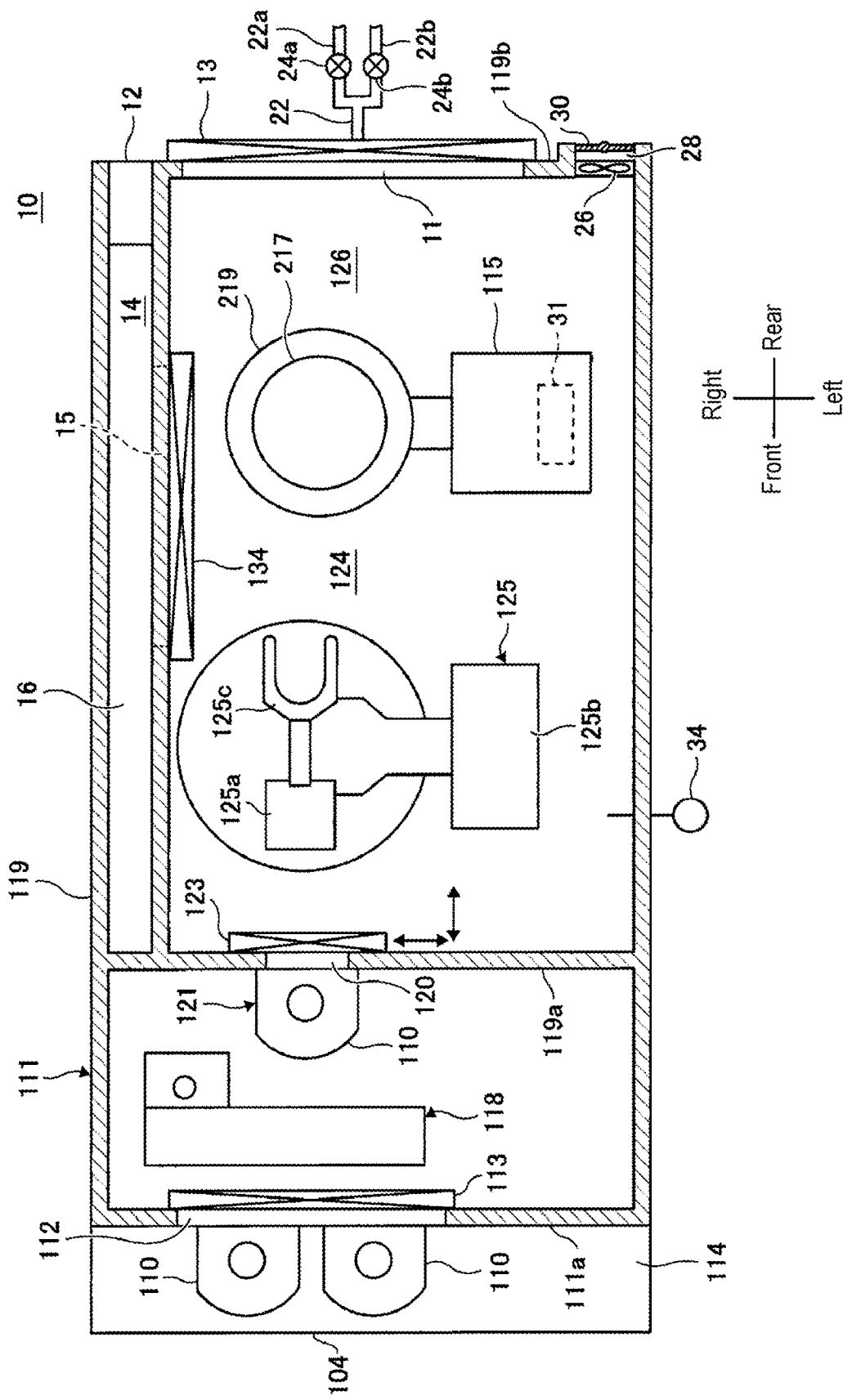
FIG. 3 is a top cross sectional view illustrating the substrate processing apparatus suitably used in embodiments of the present disclosure.

The transfer chamber 124 is a sealed container corresponding to a pressure reduction of the process chamber 201 for processing a substrate. The transfer chamber 124 is configured so that the atmosphere of the transfer chamber 124 can be an air atmosphere or an inert gas atmosphere while the transfer shelf gate valve 123 is closed. FIG. 3 is a top cross sectional view of the substrate processing apparatus 10. FIG. 4A is a partial cross sectional view of the sub housing 119 on the right side of the apparatus when the transfer chamber 124 is in an air atmosphere, and FIG. 4B is a partial cross sectional view of the sub housing 119 on the left side of the apparatus when the transfer chamber 124 is in an air atmosphere. FIG. 5A is a partial cross sectional view of the sub housing 119 on the right side of the apparatus when the transfer chamber 124 is in an inert gas atmosphere, and FIG. 5B is a partial cross sectional view of the sub housing 119 on the left side of the apparatus when the transfer chamber 124 is in an inert gas atmosphere.

A wafer transfer mechanism 125 is installed in a front region of the transfer chamber 124. The wafer transfer mechanism 125 includes a wafer transfer device 125a capable of rotating or linearly moving the wafers 200 in the horizontal direction, and a wafer transfer device elevator 125b for moving the wafer transfer device 125a up and down. By continuous operation of the wafer transfer device elevator 125b and the wafer transfer device 125a, loading and discharging of the wafers 200 on and from the boat 217 by a tweezer 125c are performed using the tweezer 125c of the wafer transfer device 125a as a mounting part of the wafers 200.

In addition, a boat elevator (substrate support elevator mechanism) 115 for moving the boat 217 up and down is installed in a rear region of the transfer chamber 124. A seal cap 219 is horizontally installed in an elevator arm 128 as a connecting member connected to an elevating stand of the boat elevator 115. The seal cap 219 is configured as a lid body which vertically supports the boat 217 and opens and closes the lower portion of the process furnace 202. The seal cap 219 is supported by the elevator arm 128 of the boat elevator 115.

An opening 11 is formed on the rear wall 119b of the sub housing 119 to communicate the inside and the outside of the transfer chamber 124, and is configured to be opened and closed by a transfer chamber door 13.

In addition, an inert gas introduction pipe (purge gas introduction pipe) 22 for supplying an inert gas (purge gas) into the transfer chamber 124 is connected to a rear wall 119b of the sub housing 119. In the inert gas introduction pipe 22, an inert gas introduction pipe 22a for introducing a large flow rate of inert gas and an inert gas introduction pipe 22b for introducing a smaller flow rate of inert gas than the inert gas introduction pipe 22a are connected to each other. Valves 24a and 24b, which are opening/closing valves, are installed in the inert gas introduction pipe 22a and the inert gas introduction pipe 22b, respectively. That is, an inert gas can be supplied in multiple flow rate patterns to the transfer chamber 124 by opening and closing the valves 24a and 24b.

Furthermore, an intake duct 14, which communicates with an intake port 12 formed on the rear wall 119b of the sub housing 119, is formed in an upper right region of the transfer chamber 124 and on an opposite side of wafer transfer device elevator 125b side and the boat elevator 115 side of the transfer chamber 124. The intake duct 14 is configured to communicate with an outlet 15. A clean unit 134 is installed in the outlet 15. The clean unit 134 includes eight intake fans 18 and a filter 20. In addition, an intake damper 16, which is an opening/closing valve, is installed in the intake duct 14.

That is, air sucked from the intake port 12 is supplied to the transfer chamber 124 via the intake duct 14, the outlet 15, and the clean unit 134, or the supply is stopped, by opening and closing the intake damper 16. That is, the air sucked from the intake port 12 is cleaned via the clean unit 134, and a clean air 133 is supplied into the transfer chamber 124.

In addition, an exhaust fan 26 and an exhaust duct 28 which exhaust the internal atmosphere of the transfer chamber 124 to the outside of the housing 111 (outside of the sub housing 119) are installed at a left region side of the transfer chamber 124 of the rear wall 119b of the sub housing 119. Three exhaust fans 26 are installed in the vertical direction. An exhaust valve 30, which is an opening/closing valve, is installed in the exhaust duct 28. That is, the internal atmosphere of the transfer chamber 124 is exhausted to the outside of the housing 111 via the exhaust fans 26 and the exhaust duct 28, and the exhaust is stopped, by opening and closing the exhaust valve 30.

A gas exhaust port 31 for exhausting the inert gas in the transfer chamber 124 is formed at the top of the boat elevator 115. An exhaust valve 32, which is an opening/closing valve, is installed in the gas exhaust port 31 for its opening and closing. That is, the inert gas introduced into the transfer chamber 124 from the inert gas introduction pipe 22 flows to the wafer transfer device 125a, and the boat 217 in the standby part 126, and thereafter, the gas is exhausted to the outside of the transfer chamber 124 via the gas exhaust port 31, or the exhaust is stopped, by opening and closing the exhaust valve 32.

Furthermore, an oximeter 34 for measuring an oxygen concentration of the transfer chamber 124 is installed in the transfer chamber 124.

<Configuration of the Controller>

Figure 6:
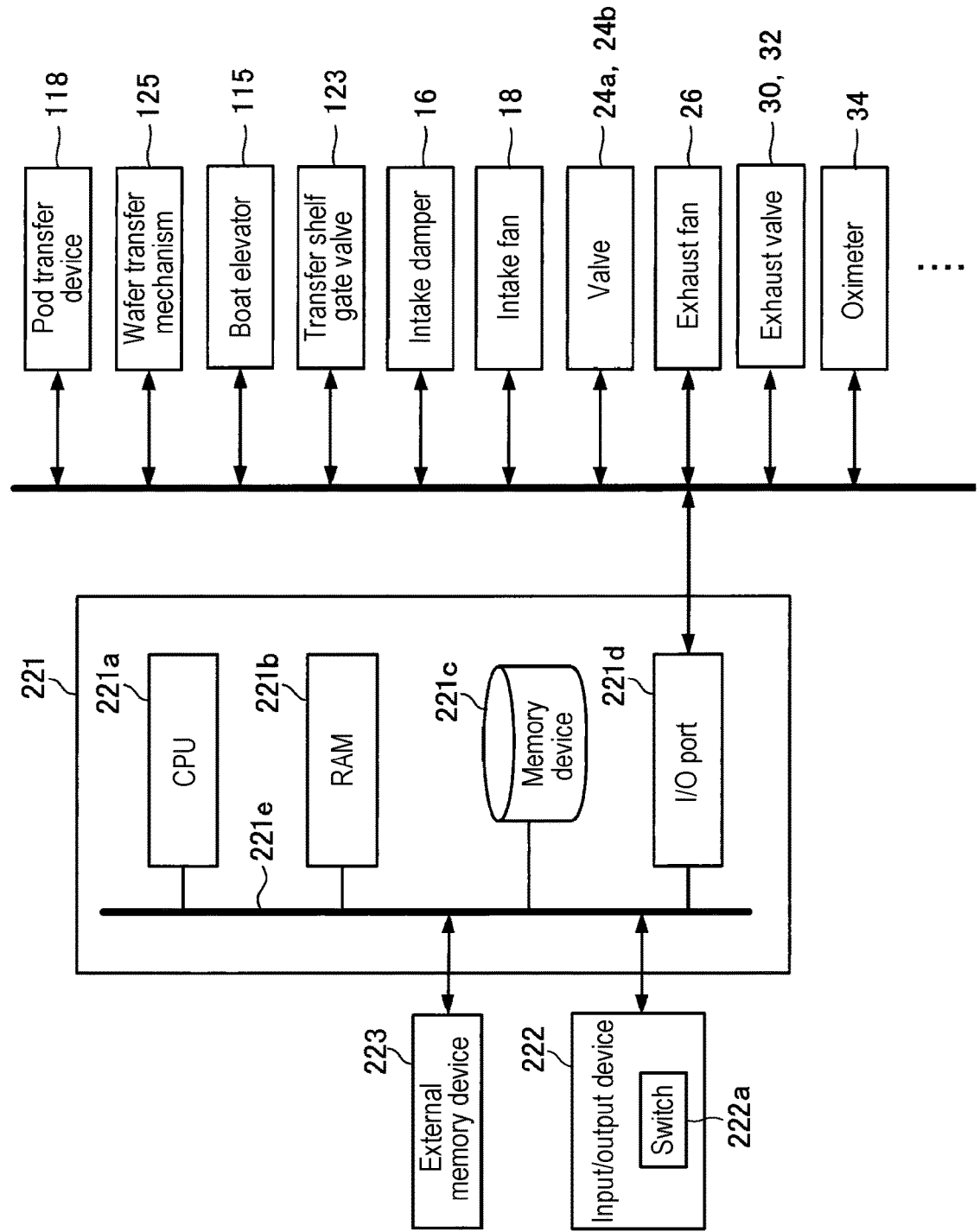
FIG. 6 is a schematic block diagram of a controller of the substrate processing apparatus suitably used in embodiments of the present disclosure, in which a control system of the controller is shown in a block diagram.
Figure 7:
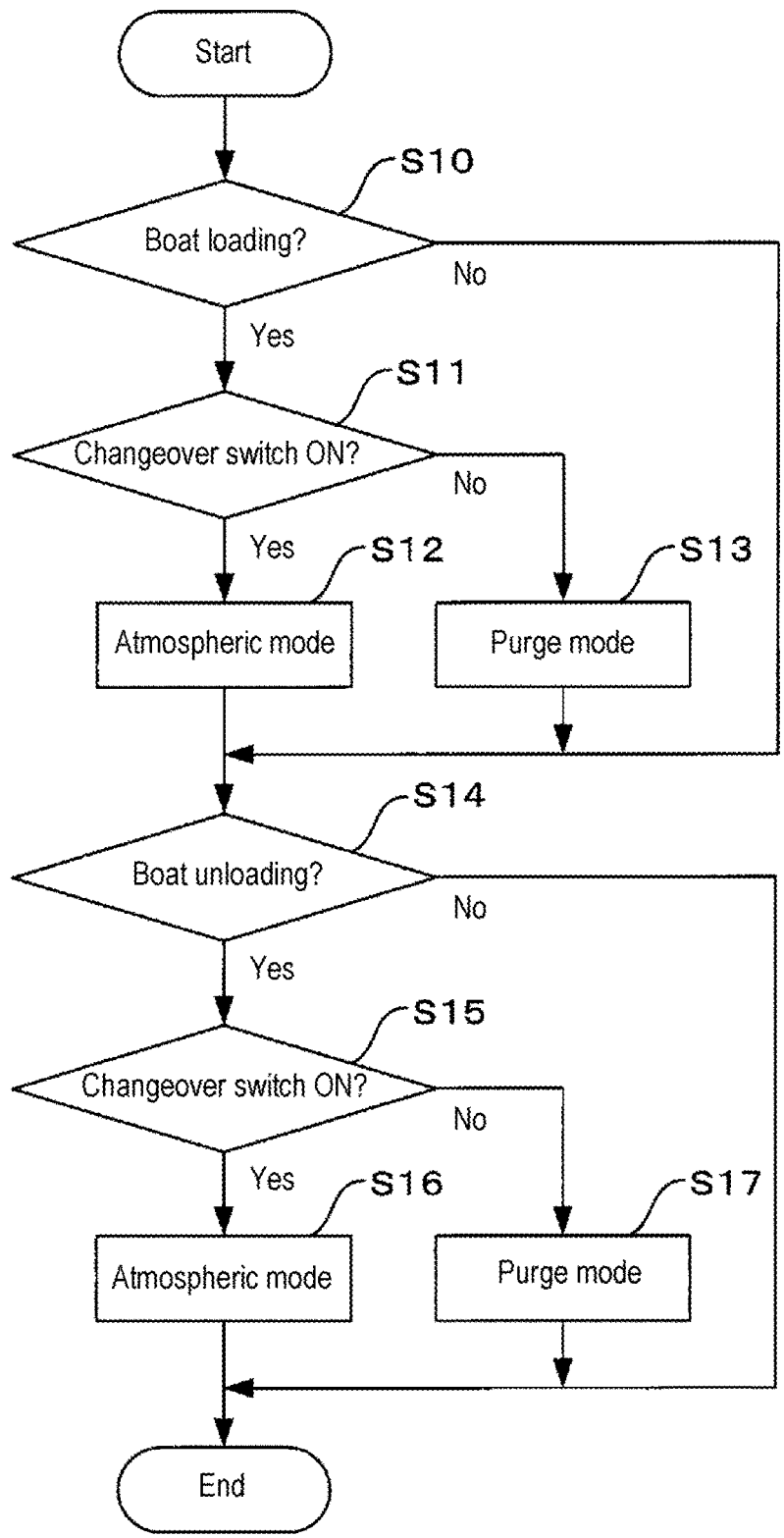
FIG. 7 is a flow chart illustrating a changeover operation between a purge mode and an atmospheric mode of the substrate processing apparatus suitably used in embodiments of the present disclosure.

As illustrated in FIG. 6, a controller 221, which is a control part (control means), is configured as a computer including a central processing unit (CPU) 221a, a random access memory (RAM) 221b, a memory device 221c, and an I/O port 221d. The RAM 221b, the memory device 221c, and the I/O port 221d are configured to exchange data with the CPU 221a via an internal bus 221e. An input/output device 222 is connected to the controller 221. A display means (display device) such as a touch panel, or the like is used as the input/output device 222.

The memory device 221c is configured by, for example, a flash memory, a hard disk drive (HDD), or the like. A control program for controlling operations of a substrate processing apparatus, a process recipe for specifying sequences and conditions of a film-forming process as described hereinbelow, or the like is readably stored in the memory device 221c. The process recipe functions as a program for causing the controller 221 to execute each sequence in the film-forming process, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 221b is configured as a memory area (work area) in which a program, data and the like read by the CPU 221a is temporarily stored.

The I/O port 221d is connected to the pod transfer device 118, the wafer transfer mechanism 125, the boat elevator 115, the transfer shelf gate valve 123, the intake damper 16, the intake fan 18, the valves 24a and 24b, the exhaust fan 26, the exhaust valves 30 and 32, the oximeter 34, and the like, as described above.

The CPU 221a is configured to read the control program from the memory device 221c and execute the same. The CPU 221a is also configured to read the recipe from the memory device 221c according to an input of an operation command from the input/output device 222. In addition, the CPU 221a is configured to control, according to the contents of the recipe thus read, the transfer operation of the pods 110 by the pod transfer device 118, the transfer operation of the wafers by the wafer transfer mechanism 125, the operation of moving the boat 217 up and down by the boat elevator 115, the opening/closing operation of the transfer shelf gate valve 123, the opening/closing operation of the valves 24a and 24b, the opening/closing operation of the intake damper 16, the operation of the intake fan 18 and the exhaust fan 26, the opening/closing operation of the exhaust valves 30 and 32, the operation of setting the activation and deactivation of the oximeter 34, the opening/closing operation of the valves 24a and 24b based on the oxygen concentration detected by the oximeter 34, and the like.

The controller 221 may be configured by installing, on the computer, the aforementioned program stored in an external memory device 223. The external memory device 223 may include, for example, a magnetic disc such as an HDD, an optical disc such as a CD, a magneto-optical disc such as an MO, a semiconductor memory such as a USB memory, and the like. The memory device 221c or the external memory device 223 is configured as a computer-readable recording medium. Hereinafter, the memory device 221c and the external memory device 223 will be generally and simply referred to as a "recording medium." When the term "recording medium" is used herein, it may indicate a case of including only the memory device 221c, a case of including only the external memory device 223, or a case of including both the memory device 221c and the external memory device 223. Furthermore, the program may be supplied to the computer using a communication means such as the Internet or a dedicated line, instead of using the external memory device 223.

The input/output device 222 displays a setting screen for a changeover between an atmospheric mode as a first function to allow the transfer chamber 124 to be in an air atmosphere and a purge mode as a second function to allow the transfer chamber 124 to be in an inert gas atmosphere. Then, a changeover switch (switch), which is a changeover means for a changeover between the atmospheric mode and the purge mode, is displayed on the setting screen. By setting an ON/OFF state of the changeover switch, it is possible for the user to perform a changeover between the atmospheric mode and the purge mode via the setting screen displayed on the input/output device 222.

Furthermore, the memory device 221c stores the ON/OFF state of the changeover switch as a parameter-setting file.

In addition, the CPU 221a normally executes boat loading and boat unloading when the changeover switch is set to be turned off and under an inert gas atmosphere in which the oxygen concentration in the transfer chamber 124 detected by the oximeter 34 is, for example, 20 ppm or lower. However, when the changeover switch described above is set to be turned on, it is set such that the oximeter 34 is deactivated and the oxygen concentration in the transfer chamber 124 is not measured.

That is, when the changeover switch is set to be turned off, the oximeter 34 is activated, and the oxygen concentration in the transfer chamber 124 is maintained at a constant concentration, for example, in a state of an inert gas atmosphere of 20 ppm or lower. Furthermore, when the changeover switch is set to be turned on, the oximeter 34 is deactivated, the supply of the inert gas into the transfer chamber 124 is stopped and the interior of the transfer chamber 124 becomes a state of an air atmosphere.

That is to say, the changeover between the purge mode and the atmospheric mode is determined according to the ON/OFF of the changeover switch during the boat loading and/or the boat unloading.

Specifically, the CPU 221a is configured to read the control program from the memory device 221c and execute the same. The CPU 221a also controls, according to the parameter setting file stored in the memory device 221c, that is the setting contents of the intake damper 16, the intake fan 18, the valves 24a and 24b of the inert gas introduction pipe 22, the exhaust fan 26, and the exhaust valves 30 and 32, before execution of the boat loading and/or the boat unloading, so as to select one of the purge mode and the atmospheric mode as described hereinbelow and execute the same. That is, it is configured so that the internal atmosphere of the transfer chamber 124 can be switched, on the recipe, to one of the air atmosphere illustrated in FIGS. 4A and 4B and the inert gas atmosphere illustrated in FIGS. 5A and 5B.

For example, when it is not intended to form a natural oxide film on the wafers 200 during the boat loading and/or boat unloading, the changeover switch is set to be turned off to select the purge mode and execute the same. When it is intended to intentionally form a natural oxide film over the wafers 200 during the boat loading and/or boat unloading so as to improve the characteristics of a device, or when the influence of the natural oxide film is small, the changeover switch may be set to be turned on to select the atmospheric mode and execute the same.

<Atmospheric Mode (First Function)>

When the atmospheric mode is selected and executed, the oximeter 34 is set to be deactivated. Then, the valves 24a and 24b of the inert gas introduction pipe 22 are closed to stop the introduction of an inert gas into the transfer chamber 124. Then, as illustrated in FIGS. 4A and 4B, the intake damper 16 is opened, and the intake fan 18 is set to be turned on for operation. That is, the air sucked from the intake port 12 is introduced into the transfer chamber 124 through the intake duct 14, the outlet 15, and the clean unit 134. Furthermore, the exhaust valve 30 is opened, and the exhaust fan 26 is set to be turned on. At this time, the exhaust valve 32 is closed. That is, in the atmospheric mode, the air is sucked and exhausted through the exhaust fan 26 and the exhaust duct 28. As a result, the air is circulated in the transfer chamber 124 and discharged to the outside of the housing 111 to allow the transfer chamber 124 to be in an air atmosphere. Thus, the air in the clean room is introduced, and the atmosphere of the transfer chamber 124 becomes an air atmosphere.

<Purge Mode (Second Function)>

When the purge mode is selected and executed, the oximeter 34 is set to be activated. Then, the valve 24a and/or the valve 24b of the inert gas introduction pipe 22 is opened to introduce a purge gas into the transfer chamber 124 from the inert gas introduction pipe 22. Then, as illustrated in FIGS. 5A and 5B, the intake damper 16 is closed, and the intake fan 18 is set to be turned off. Furthermore, the exhaust valve 30 is closed, the exhaust fan 26 is set to be turned off, the exhaust valve 32 is opened, and the purge gas is discharged from the gas exhaust port 31. Thus, the purge gas is circulated in the transfer chamber 124 to allow the transfer chamber 124 to be an inert atmosphere. That is, the oxygen concentration in the transfer chamber is lowered, and the surface of the wafers 200 in the transfer chamber 124 is prevented from being naturally oxidized.

(2) Substrate Processing

Next, an operation of the substrate processing apparatus 10 using the aforementioned configuration will be described with reference to FIGS. 7 to 11H.

In the following descriptions, the operations of the respective parts constituting the substrate processing apparatus 10 are controlled by the controller 221. According to the present embodiments, control of four patterns 1 to 4 as follows is possible on a recipe by assigning ON/OFF of the changeover switch during the boat loading and boat unloading to control a changeover between the atmospheric mode and the purge mode.

<Pattern 1>

In pattern 1, a case where the changeover switch during the boat loading is set to be turned off and the changeover switch during the boat unloading is set to be turned off, i.e., a case where the interior of the transfer chamber 124 is in an inert gas atmosphere during the boat loading and in an inert gas atmosphere during the boat unloading, will be described as an example.

As illustrated in FIGS. 1 and 2, when the pod 110 is supplied to the load port 114, the pod loading/unloading port 112 is opened by the front shutter 113, and the pod 110 on the load port 114 is loaded into the housing 111 from the pod loading/unloading port 112 by the pod transfer device 118. The loaded pod 110 is automatically transferred and delivered by the pod transfer device 118 to a designated mounting part 117 of the pod shelf 105 and temporarily stored, and then transferred from the pod shelf 105 to one pod opener 121 and transferred to the mounting table 122, or directly transferred to the pod opener 121 and transferred to the mounting table 122. At this time, the wafer-loading/unloading port 120 of the pod opener 121 is closed by the transfer shelf gate valve 123, and the clean air 133 is circulated and filled in the transfer chamber 124.

An opening side end surface of the pod 110 mounted on the mounting table 122 is pressed against the opening edge of the wafer-loading/unloading port 120 in the front wall 119a of the sub housing 119, and the cap that closes the opening of the pod 110 is removed by the cap-attaching/detaching mechanism to open the pod 110.

Figure 8A:
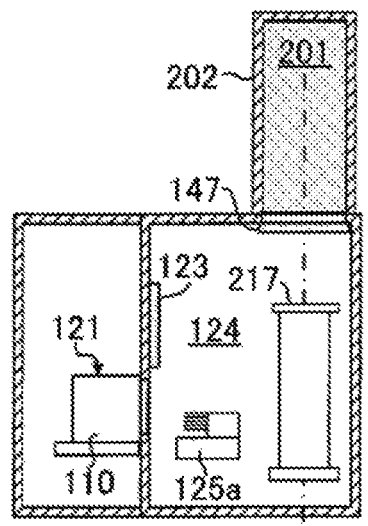
Figure 8B:
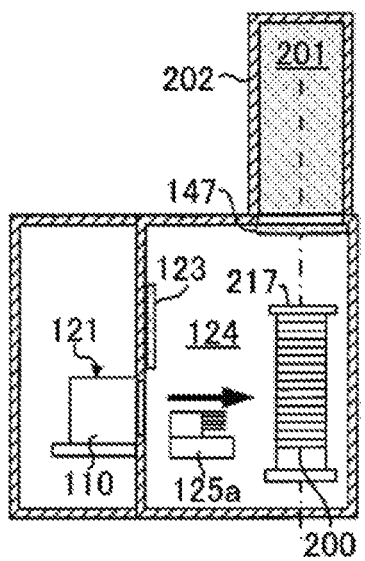

As illustrated in FIG. 8A, when the pod 110 is opened by the pod opener 121 and the transfer shelf gate valve 123 is opened, as illustrated in FIG. 8B, the wafers 200 are discharged from the pod 110 by the tweezer 125c of the wafer transfer device 125a and loaded into the boat 217 that stands by in the standby part 126 behind the transfer chamber 124. The wafer transfer device 125a which has delivered a predetermined number of wafers 200 to the boat 217 is returned to the pod 110, and loads subsequent wafers 200 on the boat 217.

At this time, another pod 110 is transferred from the pod shelf 105 to the other (lower or upper) pod opener 121 by the pod transfer device 118, and the opening operation of the pod 110 by the pod opener 121 is simultaneously performed. Furthermore, in FIGS. 8A to 11H, illustration of the other pod opener 121 is omitted.

Figure 8C:
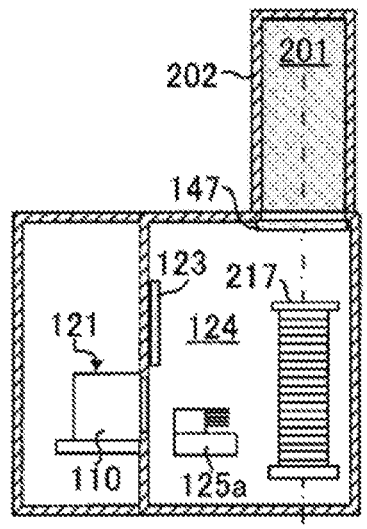
Figure 8D:
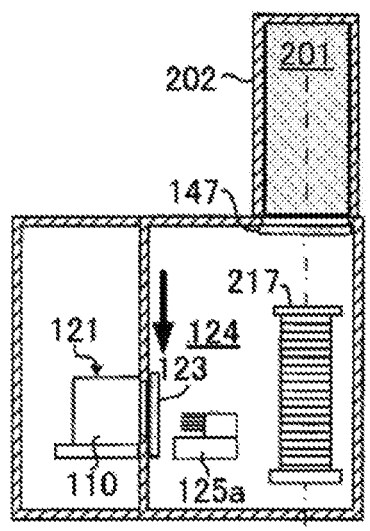

As illustrated in FIG. 8C, when the predetermined number of wafers 200 are loaded into the boat 217, the transfer shelf gate valve 123 is closed as illustrated in FIG. 8D. The processing of FIGS. 8A to 8D described above is performed in a state in which the transfer chamber 124 is in an air atmosphere.

Figure 8E:
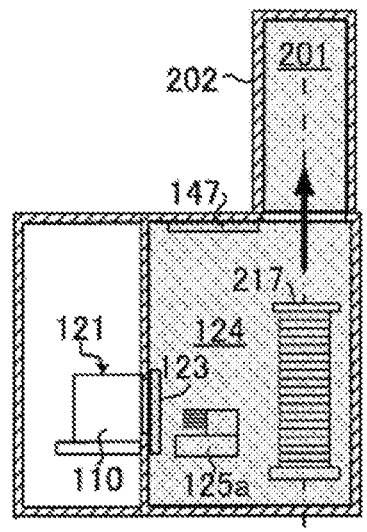

Then, before the boat loading is performed (step S10), it is determined whether or not the changeover switch during the boat loading is tuned on (step S11). As pattern 1, when the changeover switch during the boat loading is turned off ("No" at step S11), the aforementioned purge mode is selected (step S13), and the transfer chamber 124 is switched to a state of an inert gas atmosphere. Then, the lower end portion of the process furnace 202 closed by the furnace port shutter 147 is opened as illustrated in FIG. 8E. Subsequently, the seal cap 219 is lifted up by the boat elevator 115 so that the boat 217 supporting a group of wafers 200 is loaded into the process chamber 201 (boat loading). As described above, by performing the boat loading in a state in which the transfer chamber 124 is in an inert gas atmosphere, it is possible to suppress formation of a natural oxide film before film formation.

Figure 8F:
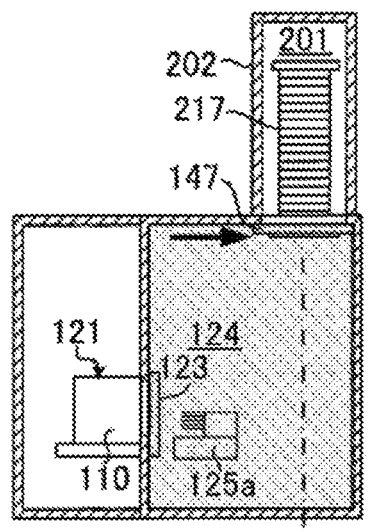

After the boat loading, as illustrated in FIG. 8F, the furnace port shutter 147 is closed in a state in which the transfer chamber 124 is substituted by an inert gas atmosphere, and the film-forming process (substrate processing) is performed on the wafers 200 in the process chamber 201.

Figure 8G:
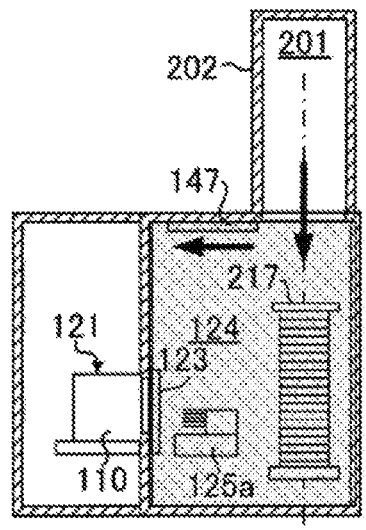

Then, when the film-forming process is completed, before the boat unloading is performed (step S14), it is determined whether the changeover switch during the boat unloading is turned on (step S15). As pattern 1, when the changeover switch during the boat unloading is turned off ("No" at step S15), the aforementioned purge mode is selected (step S17), and in a state in which the transfer chamber 124 is in an inert gas atmosphere, as illustrated in FIG. 8G, the furnace port shutter 147 is opened, and the boat 217 is unloaded from the process chamber 201 to the transfer chamber 124 (boat unloading). As described above, by performing the boat unloading in a state in which the transfer chamber 124 is in an inert gas atmosphere, it is possible to suppress formation of a natural oxide film after film formation.

Figure 8H:
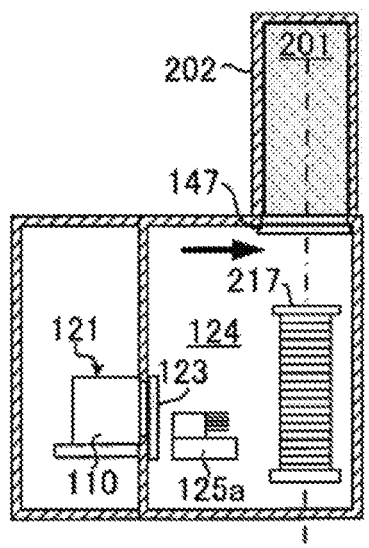

Then, as illustrated in FIG. 8H, when the furnace port shutter 147 is closed after the boat unloading, the natural oxide film is removed by allowing the transfer chamber 124 to be in a state of an inert gas atmosphere while the wafers 200 are being cooled. Then, when the wafers 200 are cooled, an atmosphere return is performed. That is, the exhaust valve 32 is opened, and the purge gas is discharged from the gas exhaust port 31. In an environment where the transfer chamber 124 is filled with an inert gas, the atmosphere return is performed because the human body is affected by the lack of oxygen or the like due to a decrease in the oxygen concentration.

Figure 8I:
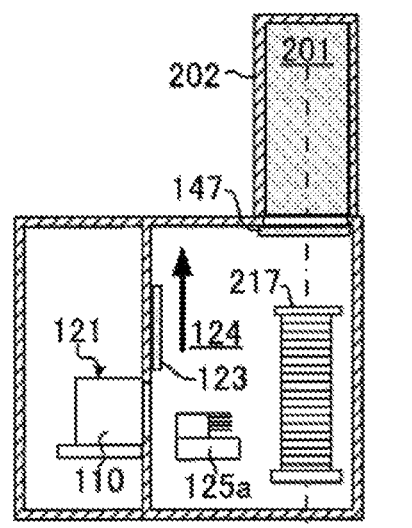
Figure 8J:
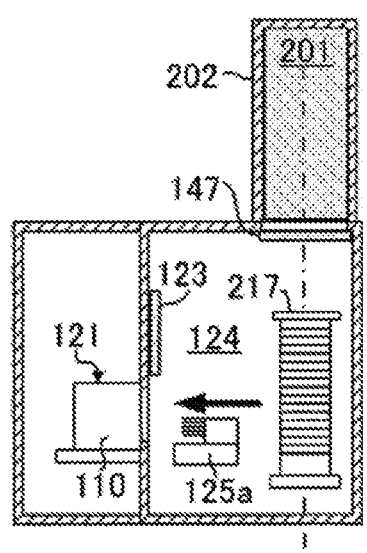

Then, when the oxygen concentration of the transfer chamber 124 is, for example, 18.5% or higher, which the human body is not affected, by the oximeter 34, the transfer shelf gate valve 123 is opened as illustrated in FIG. 8I. And, as illustrated in FIG. 8J, the wafers 200 are discharged from the boat 217 to the pod 110, and as illustrated in FIG. 8K, the wafers 200 and the pod 110 are unloaded to the outside of the housing 111. Thereafter, another pod 110 in which unprocessed wafers 200 are accommodated is transferred, and the aforementioned processing is performed.

<Pattern 2>

In pattern 2, a case where the changeover switch during the boat loading is set to be turned on and the changeover switch during the boat unloading is set to be turned off, i.e., a case where the air atmosphere is applied during the boat loading and the inert gas atmosphere is applied during the boat unloading, will be described with reference to FIGS. 9A to 9K. In the following, the same parts as pattern 1 described above will not be described, and only different parts will be described.

Figure 9A:
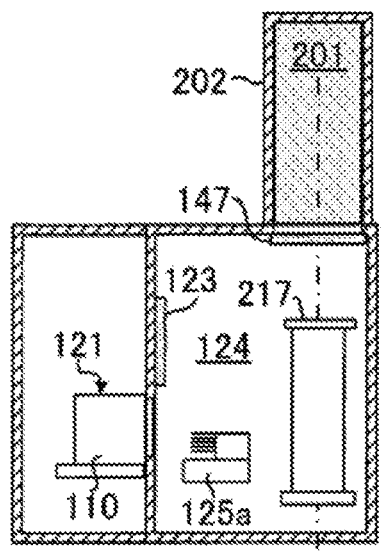
FIGS. 9A to 9K are views illustrating an example (pattern 2) of the operation in the transfer chamber of the substrate processing apparatus suitably used in embodiments of the present disclosure.
Figure 9B:
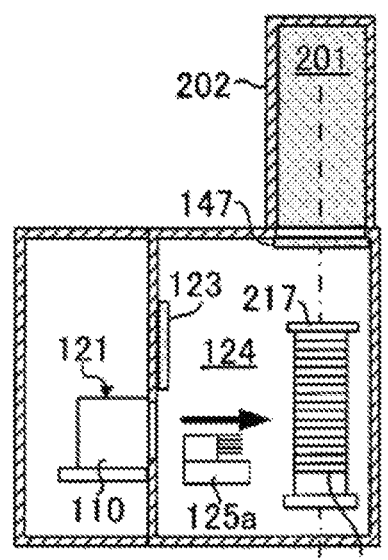
Figure 9C:
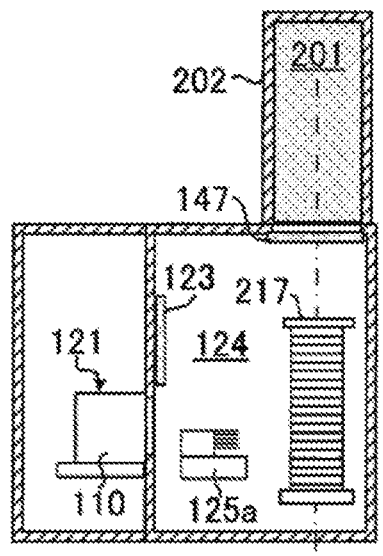
Figure 9D:
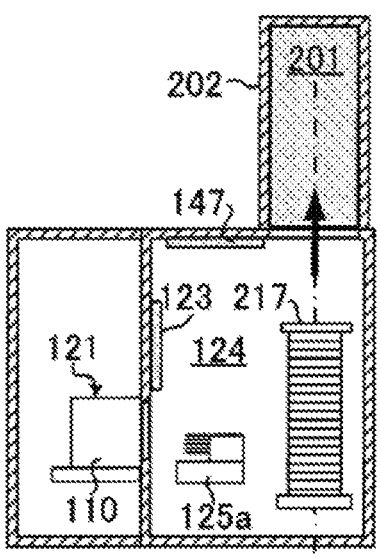

In pattern 2, as illustrated in FIGS. 9A to 9C, when a predetermined number of wafers 200 are loaded into the boat 217 in a state in which the transfer chamber 124 is in an air atmosphere, before the boat loading is performed (step S10), it is determined whether or not the changeover switch during the boat loading is turned on (step S11). As pattern 2, when the changeover switch during the boat loading is turned on ("Yes" at step S11), as illustrated in FIG. 9D, the aforementioned atmospheric mode is selected (step S12) while the transfer shelf gate valve 123 is opened, and the transfer chamber 124 is bought into a state of an air atmosphere. Then, the lower end portion of the process furnace 202 closed by the furnace port shutter 147 is opened, and the seal cap 219 is lifted up by the boat elevator 115 so that the boat 217 supporting the group of wafers 200 is loaded into the process furnace 202. That is, the boat 217 is transferred from the transfer chamber 124 to the process chamber 201 in the state of the air atmosphere, with the transfer shelf gate valve 123 opened. As described above, by performing the boat loading in a state in which the transfer chamber 124 is in an air atmosphere, a natural oxide film can be intentionally formed before film formation to change the characteristics of a device to be produced.

Figure 9E:
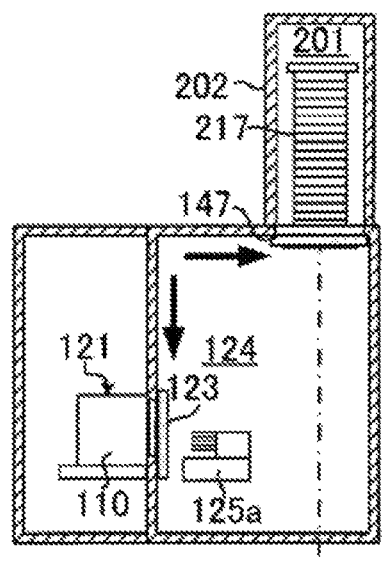
Figure 9F:
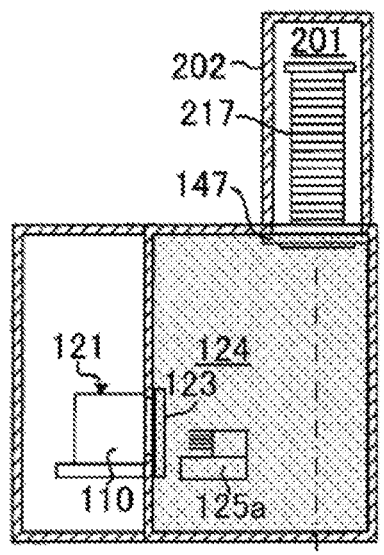

After the boat loading, as illustrated in FIG. 9E, the furnace port shutter 147 and the transfer shelf gate valve 123 are closed, and the film-forming process (substrate processing) is performed on the wafers 200 in the process chamber 201. Then, it is determined whether or not the changeover switch is turned on before execution of the boat unloading (step S15). As pattern 2, when the changeover switch during the boat unloading is turned off ("No" at step S15), the aforementioned purge mode is selected (step S17), and the transfer chamber 124 is switched from the atmospheric mode to the purge mode. That is, as illustrated in FIG. 9F, the transfer chamber 124 is substituted by the state of the inert gas atmosphere from the state of the air atmosphere.

Figure 9G:
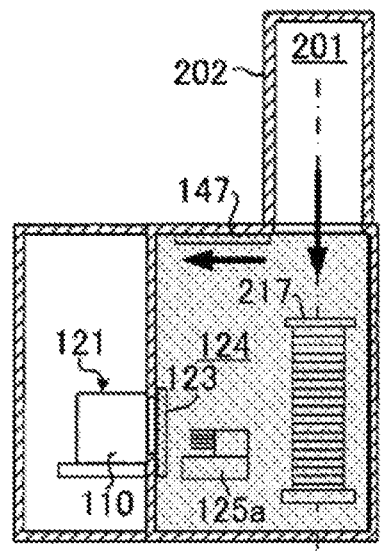

Then, when the film-forming process is completed, as illustrated in FIG. 9G, the furnace port shutter 147 is opened and the boat 217 is unloaded from the process chamber 201 to the transfer chamber 124 in a state in which the transfer chamber 124 is in an inert gas atmosphere. As described above, by performing the boat unloading in a state in which the transfer chamber 124 is in an inert gas atmosphere, it is possible to suppress formation of a natural oxide film after film formation.

Figure 9H:
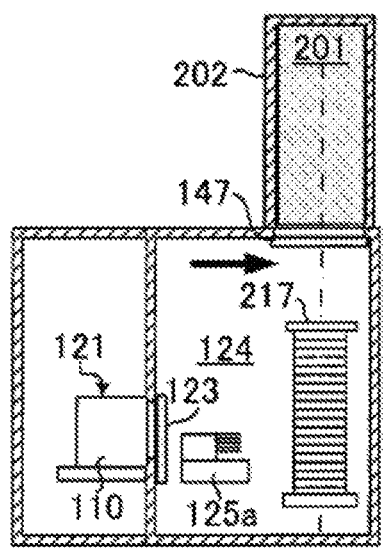

Then, after the boat unloading, as illustrated in FIG. 9H, when the furnace port shutter 147 is closed, the exhaust valve 32 is opened, and the inert gas is exhausted via the gas exhaust port 31 and the atmosphere return is performed.

Figure 9I:
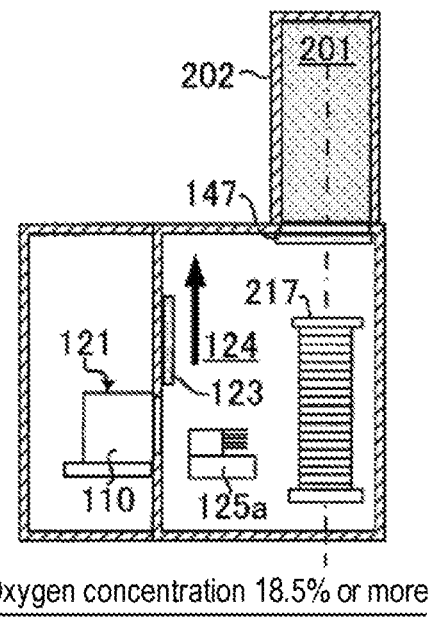
Figure 9J:
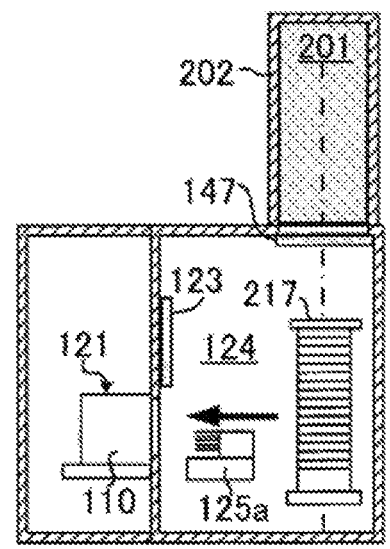
Figure 9K:
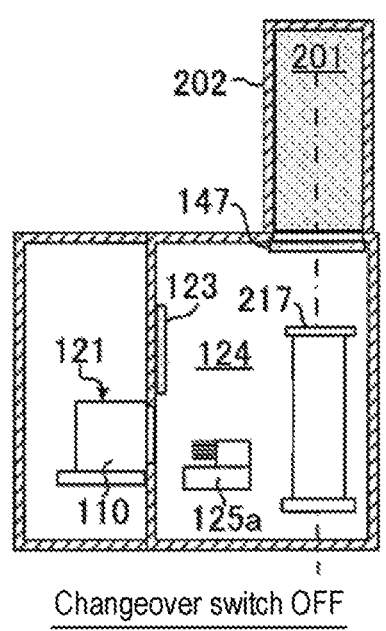

Then, when the oxygen concentration of the transfer chamber 124 reaches 18.5% or higher by the oximeter 34, the transfer shelf gate valve 123 is opened as illustrated in FIG. 9I. And, as illustrated in FIG. 9J, the wafers 200 are discharged from the boat 217 to the pod 110, and as illustrated in FIG. 9K, the wafers 200 and the pod 110 are unloaded to the outside of the housing.

<Pattern 3>

In pattern 3, a case where the changeover switch during the boat loading is set to be turned off and the changeover switch during the boat unloading is set to be turned on, i.e., a case where the inert gas atmosphere is applied during the boat loading and the air atmosphere is applied during the boat unloading, will be described with reference to FIGS. 10A to 10K.

Figure 10A:
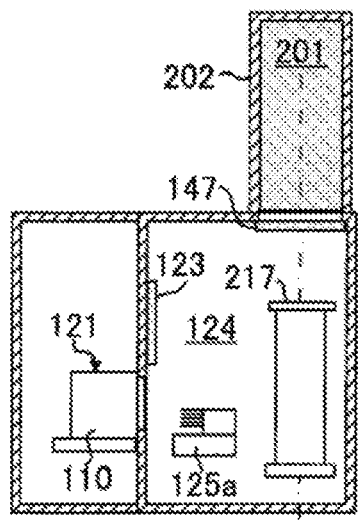
FIGS. 10A to 10K are views illustrating an example (pattern 3) of the operation in the transfer chamber of the substrate processing apparatus suitably used in embodiments of the present disclosure.
Figure 10B:
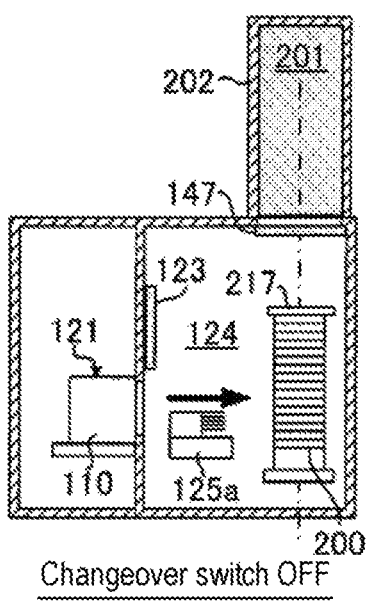
Figure 10C:
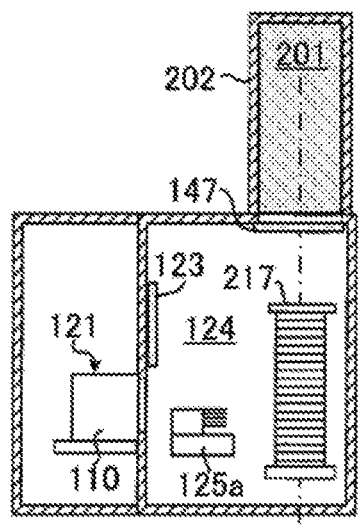
Figure 10D:
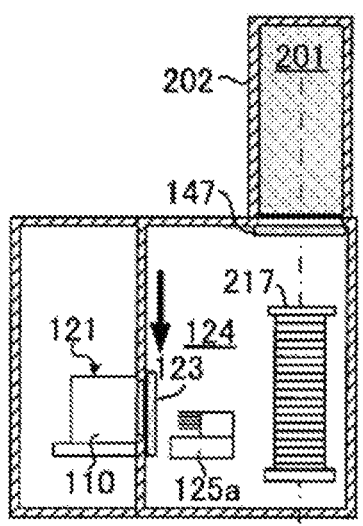
Figure 10E:
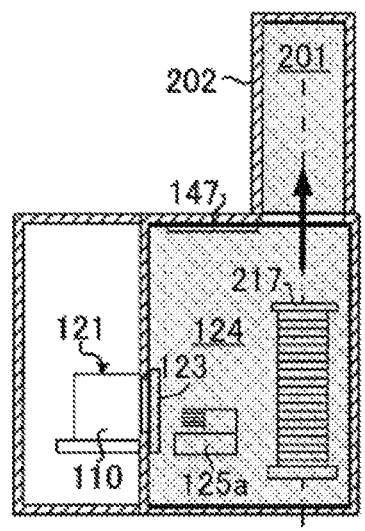

FIGS. 10A to 10D are similar to FIGS. 8A to 8D of pattern 1 described above. Then, before the boat loading is performed (step S10), it is determined whether or not the changeover switch during the boat loading is turned on (step S11), and as pattern 3, when the changeover switch during the boat loading is turned off ("No" at step S11), the aforementioned purge mode is selected (step S13), and the transfer chamber 124 is switched to a state of an inert gas atmosphere. Then, the lower end portion of the process furnace 202 closed by the furnace port shutter 147 is opened as illustrated in FIG. 10E. Subsequently, the seal cap 219 is lifted up by the boat elevator 115 so that the boat 217 supporting the group of wafers 200 is loaded into the process chamber 201. As described above, by performing the boat loading in a state in which the transfer chamber 124 is in an inert gas atmosphere, it is possible to suppress formation of a natural oxide film before film formation.

Figure 10F:
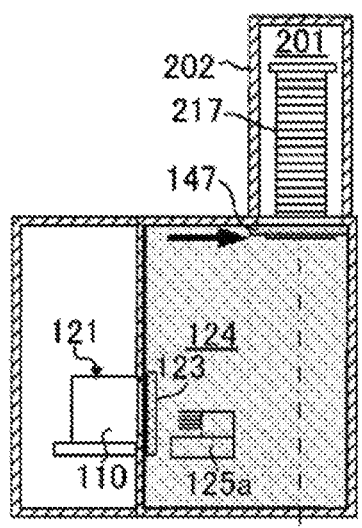

After the boat loading, as illustrated in FIG. 10F, the furnace port shutter 147 is closed in a state in which the transfer chamber 124 is substituted by an inert gas atmosphere, and the film-forming process (substrate processing) is performed on the wafers 200 in the process chamber 201.

Figure 10G:
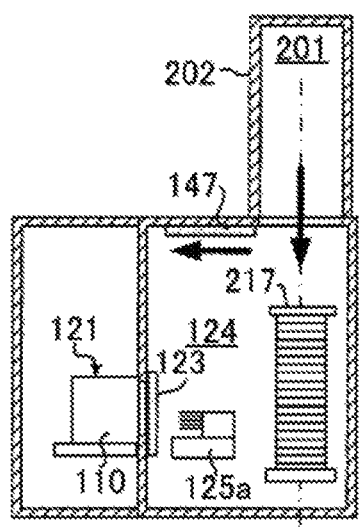

Then, when the film-forming process is completed, before the boat unloading is performed (step S14), it is determined whether the changeover switch during the boat unloading is turned on (step S15). As pattern 3, when the changeover switch during the boat unloading is turned on ("Yes" at step S15), the aforementioned atmospheric mode is selected (step S16), and the transfer chamber 124 is switched from the purge mode to the atmospheric mode. That is, the transfer chamber 124 is substituted by the state of the air atmosphere from the state of the inert gas atmosphere. Then, as illustrated in FIG. 10G, the furnace port shutter 147 is opened, and the boat 217 is unloaded from the process chamber 201 to the transfer chamber 124. As described above, by performing the boat unloading in a state in which the transfer chamber 124 is in an air atmosphere, a natural oxide film can be intentionally formed after film formation to change the characteristics of a device to be produced.

Figure 10H:
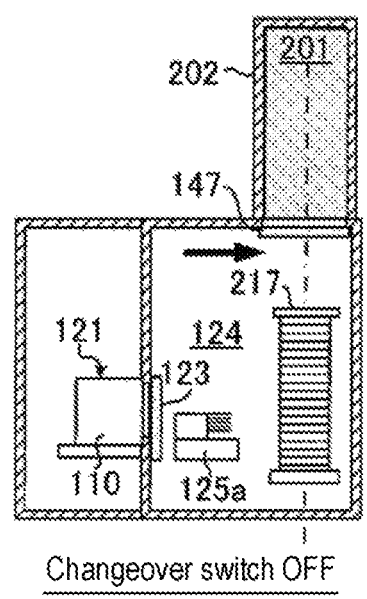

Then, after the boat unloading, as illustrated in FIG. 10H, the furnace port shutter 147 is closed, and the atmosphere return is performed.

Figure 10I:
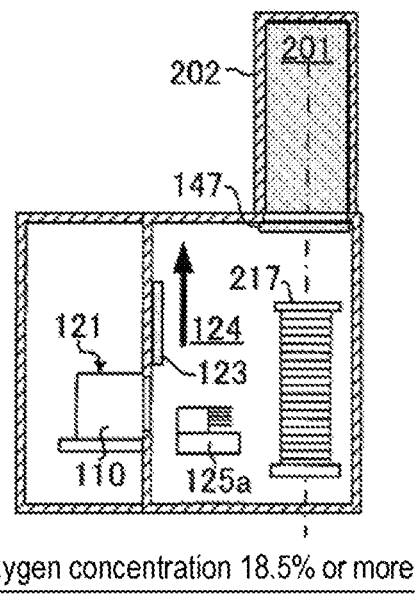
Figure 10J:
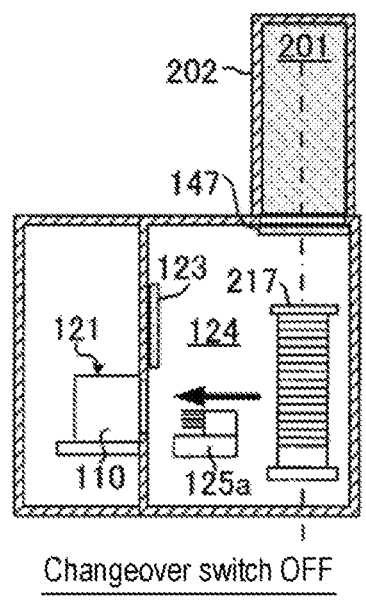
Figure 10K:
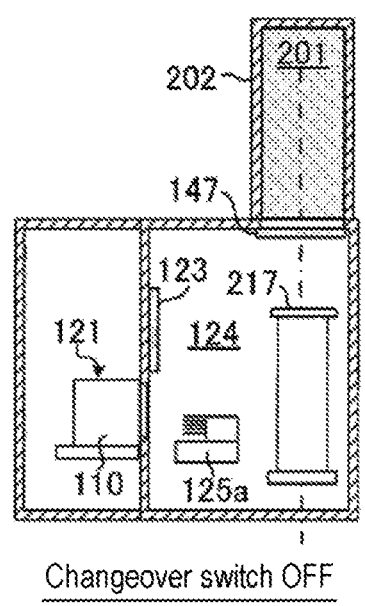

Then, when the oxygen concentration of the transfer chamber 124 reaches 18.5% or higher by the oximeter 34, the transfer shelf gate valve 123 is opened as illustrated in FIG. 10I. And, as illustrated in FIG. 10, the wafers 200 are discharged from the boat 217 to the pod 110, and as illustrated in FIG. 10K, the wafers 200 and the pod 110 are unloaded to the outside of the housing 111. Thereafter, another pod 110 in which unprocessed wafers 200 are accommodated is transferred, and the aforementioned processing is performed.

<Pattern 4>

In pattern 4, in a case where the changeover switch during the boat loading is set to be turned on and the changeover switch during the boat unloading is set to be turned on, i.e., in a case where the air atmosphere is applied during both the boat loading and the boat unloading, will be described with reference to FIGS. 11A to 11H.

Figure 11A:
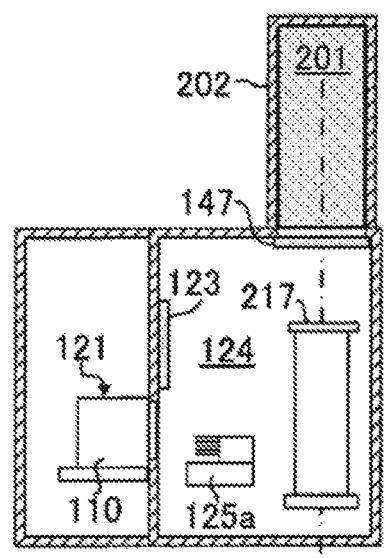
FIGS. 11A to 11H are views illustrating an example (pattern 4) of the operation in the transfer chamber of the substrate processing apparatus suitably used in embodiments of the present disclosure.
Figure 11B:
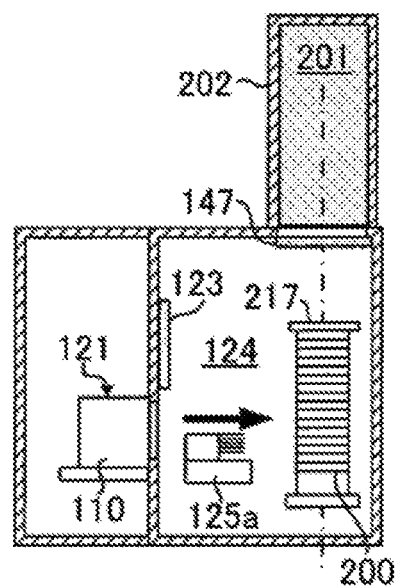
Figure 11C:
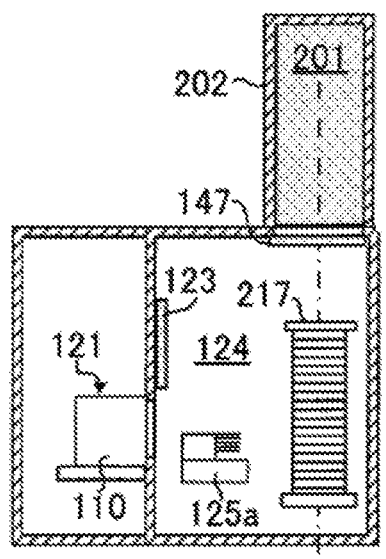
Figure 11D:
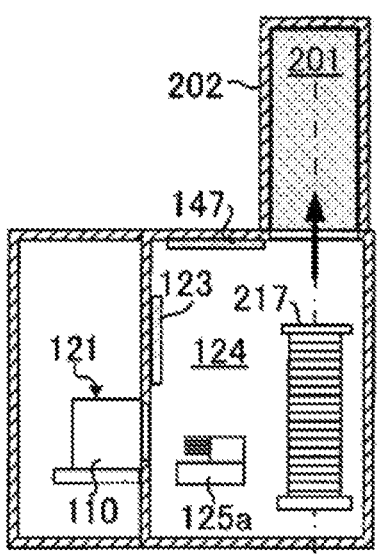

In pattern 4, as illustrated in FIGS. 11A to 11C, when a predetermined number of wafers 200 are loaded into the boat 217, before the boat loading is performed (step S10), it is determined whether or not the changeover switch during the boat loading is turned on (step S11). As pattern 4, when the changeover switch during the boat loading is turned on ("Yes" at step 11), as illustrated in FIG. 11D, the aforementioned atmospheric mode is selected (step S12) while the transfer shelf gate valve 123 is opened. Then, the lower end portion of the process furnace 202 closed by the furnace port shutter 147 is opened, and the seal cap 219 is lifted up by the boat elevator 115 so that the boat 217 supporting the group of wafers 200 is loaded into the process furnace 202 (boat loading). That is, the boat 217 is transferred from the transfer chamber 124 to the process chamber 201 in the state of the air atmosphere, with the transfer shelf gate valve 123 opened.

Figure 11E:
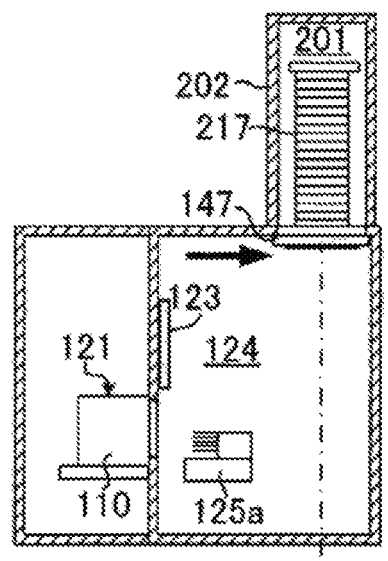

After the boat loading, as illustrated in FIG. 11E, the furnace port shutter 147 is closed, and the film-forming process (substrate process) is performed on the wafers 200 in the process chamber 201.

Figure 11F:
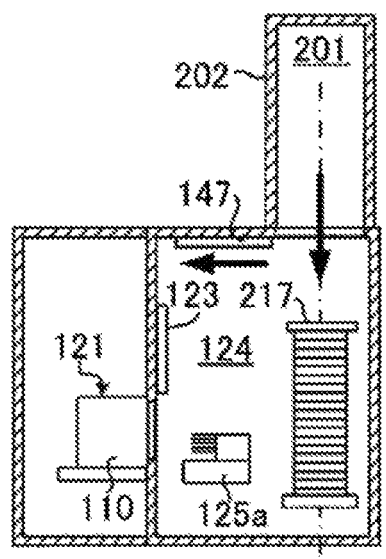

Then, when the film-forming process is completed, before the boat unloading is performed (step S14), it is determined whether the changeover switch during the boat unloading is turned on (step S15). As pattern 4, when the changeover switch during the boat unloading is turned on ("Yes" at step S15), the aforementioned atmospheric mode is selected (step S16), and in a state in which the transfer chamber 124 is in an air atmosphere, as illustrated in FIG. 11F, the furnace port shutter 147 is opened, and the boat 217 is unloaded from the process chamber 201 to the transfer chamber 124 (boat unloading). As described above, by performing the boat loading and the boat unloading in a state in which the transfer chamber 124 is in an air atmosphere, a natural oxide film can be intentionally formed before and after film formation to change the characteristics of a device to be produced.

Figure 11G:
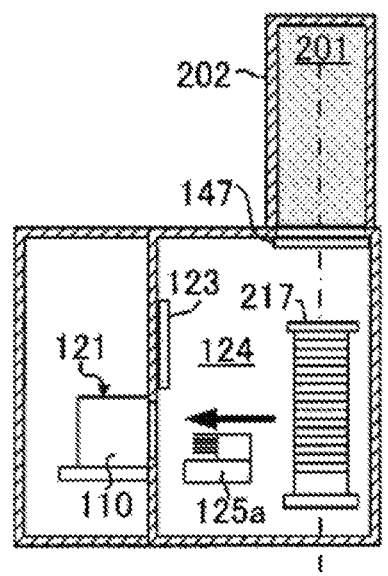
Figure 11H:
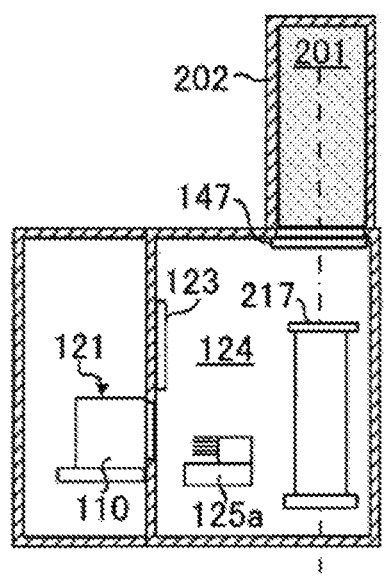

Then, after the boat unloading, as illustrated in FIG. 11G, the furnace port shutter 147 is closed, and the wafers 200 are discharged from the boat 217 to the pod 110, and as illustrated in FIG. 11H, the wafers 200 and the pod 110 are unloaded to the outside of the housing.

Pattern 4 is configured to be operated as a normal open furnace. That is, even in the open furnace, it is possible to switch and use the changeover switch in the recipe of the present embodiments.

(3) Effects According to the Present Embodiments

According to the present embodiments, the atmosphere of the transfer chamber can be changed according to a kind of a process or a kind of a film to be formed. In addition, whether to form a natural oxide film can also be selected.

OTHER EMBODIMENTS

While embodiments of the present disclosure have been specifically described above, the present disclosure is not limited to the aforementioned embodiments but may be variously modified without departing from the spirit of the present disclosure.

In the aforementioned embodiments, there has been described an example in which, when the atmospheric mode is selected and executed, the oximeter 34 is set to be deactivated, the valves 24a and 24b of the inert gas introduction pipe 22 are closed to stop the introduction of the inert gas to the transfer chamber 124. However, the present disclosure is not limited to the aforementioned embodiments, and the amount (thickness) of a natural oxide film formed on a wafer 200 may be controlled by opening the valve 24a and/or the valve 24b of the inert gas introduction pipe 22 to supply the inert gas, without setting the oximeter 34 to be deactivated in the atmospheric mode.

Recipes used in substrate processing may be prepared individually according to the processing contents and may be stored in the memory device 221c via a telecommunication line or an external memory device 223. Moreover, at the start of substrate processing, the CPU 221a may properly select an appropriate recipe from the recipes stored in the memory device 221c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 222 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, a film-forming process may be performed by the processing procedures and processing conditions similar to those of the embodiments described above. Effects similar to those of the embodiments described above may be achieved.

The embodiments described above may be appropriately combined with one another. The processing procedures and processing conditions at this time may be similar to, for example, the processing procedures and processing conditions of the aforementioned embodiments.

According to the present disclosure in some embodiments, it is possible to change an atmosphere of a transfer chamber according to a kind of a process or a kind of a film to be formed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    an intake damper and an intake fan configured to communicate with an intake port that sucks air to a transfer chamber connected to a process chamber in which processing of a substrate is performed;
    a valve of an inert gas introduction pipe configured to supply an inert gas to the transfer chamber;
    an exhaust fan and a first exhaust valve installed in the transfer chamber;
    a gas exhaust port installed between an inside and an outside of the transfer chamber and above a substrate support elevator mechanism installed in the transfer chamber that is configured to transfer a substrate support to the process chamber to process the substrate and then transfer the substrate support to the transfer chamber;
    a second exhaust valve installed in the gas exhaust port, and configured to open the gas exhaust port to exhaust the inert gas to the outside of the transfer chamber and close the gas exhaust port to stop the exhaust of the inert gas;
    a gate valve configured to open the transfer chamber into a space whose atmosphere is an air atmosphere and close the transfer chamber into a closed space;
    a switch configured to select one of:
        an atmospheric mode in which the gate valve opens the transfer chamber to have an atmosphere of the air atmosphere and the second exhaust valve closes the gas exhaust port; and
        a purge mode in which the gate valve closes the transfer chamber to have an atmosphere of an inert gas atmosphere and the second exhaust valve opens the gas exhaust port; and
    a controller configured to control each of the intake damper, the intake fan, the valve of the inert gas introduction pipe, the exhaust fan, the first exhaust valve, the second exhaust valve, and the gate valve to execute one of the atmospheric mode and the purge mode,
    wherein the controller is configured to be capable of transferring the substrate support on which the substrate is supported between the transfer chamber and the process chamber, in a state in which the gate valve is opened, when the switch selects the atmospheric mode.

2. The apparatus according to claim 1, wherein, when the atmospheric mode is executed, the controller is configured to perform a control such that the atmosphere of the transfer chamber is the air atmosphere by:
    setting an oximeter that measures an oxygen concentration of the transfer chamber to be deactivated;
    setting the intake fan to be turned on and opening the intake damper;
    setting the exhaust fan to be turned on and opening the first exhaust valve; and
    setting the valve of the inert gas introduction pipe to be closed.

3. The apparatus according to claim 1, wherein, when the purge mode is executed, the controller is configured to perform a control such that the atmosphere of the transfer chamber is the inert gas atmosphere by:
    setting an oximeter that measures an oxygen concentration of the transfer chamber to be activated;

setting the intake fan to be turned off and closing the intake damper;

setting the exhaust fan to be turned off and closing the first exhaust valve; and setting the valve of the inert gas introduction pipe to be opened.

4. The apparatus according to claim 1, wherein the controller is configured to perform a control such that the substrate support is loaded into the process chamber with the substrate loaded to process the substrate, and then the substrate support is unloaded to the transfer chamber, and wherein the controller is configured to control each of the intake damper, the intake fan, the valve of the inert gas introduction pipe, the exhaust fan, the first exhaust valve, and the gate valve during at least one selected from the group of the loading and the unloading of the substrate support.

5. The apparatus according to claim 1, wherein the transfer chamber is configured to further include:

an oximeter that measures an oxygen concentration of the transfer chamber.

6. The apparatus according to claim 1, wherein the controller is configured to determine an ON/OFF state of the switch used when selecting one of the atmospheric mode and the purge mode.

7. The apparatus according to claim 6, wherein the controller is configured to store the ON/OFF state of the switch as a parameter setting file in a memory.

8. The apparatus according to claim 6, wherein the controller is configured to display, on a display device, a setting screen configured to set the ON/OFF state of the switch.

9. The apparatus according to claim 1, wherein the controller is configured to transfer the substrate support from the transfer chamber to the process chamber, in the state in which the gate valve is opened.

10. The apparatus according to claim 1, wherein the controller is configured to substitute the atmosphere of the transfer chamber with the air atmosphere from the inert gas atmosphere, in a state in which the gate valve is closed.

11. The apparatus according to claim 5, wherein the controller is configured to perform a control such that the gate valve is opened from a process of loading the substrate on the substrate support to a process of discharging the substrate from the substrate support when the switch selects the atmospheric mode during loading and unloading of the substrate support.

12. The apparatus according to claim 1, wherein the controller is configured to perform a control to execute processes from transferring the substrate support to the process chamber to transferring the substrate support to the transfer chamber, in the state in which the gate valve is opened.

13. The apparatus according to claim 1, wherein the controller is configured to transfer the substrate support from the process chamber to the transfer chamber, in the state in which the gate valve is opened.

* * * * *